United States Patent
Chen et al.

(10) Patent No.: US 7,236,034 B2
(45) Date of Patent: Jun. 26, 2007

(54) SELF CORRECTING SCHEME TO MATCH PULL UP AND PULL DOWN DEVICES

(75) Inventors: Wayne T. Chen, Plano, TX (US); Narasimhan R. Trichy, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/901,833

(22) Filed: Jul. 27, 2004

(65) Prior Publication Data

US 2006/0022735 A1 Feb. 2, 2006

(51) Int. Cl.
H03H 11/06 (2006.01)
(52) U.S. Cl. ...................... 327/273; 327/279
(58) Field of Classification Search ........ 327/261–265, 327/270–273, 277–279, 284–286, 151, 160; 326/86
See application file for complete search history.

(56) References Cited

U.S. PATENT DOCUMENTS

| | | | | |
|---|---|---|---|---|
| 4,364,094 A | * | 12/1982 | French et al. ............... | 348/732 |
| 4,637,018 A | * | 1/1987 | Flora et al. ................. | 714/700 |
| 5,049,766 A | * | 9/1991 | van Driest et al. .......... | 327/269 |
| 5,448,180 A | * | 9/1995 | Kienzler et al. .............. | 326/15 |
| 5,566,363 A | * | 10/1996 | Senda ......................... | 455/126 |
| 5,731,725 A | * | 3/1998 | Rothenberger et al. ..... | 327/262 |
| 6,154,061 A | * | 11/2000 | Boezen et al. ................ | 326/86 |
| 6,246,274 B1 | * | 6/2001 | Sakai et al. .................. | 327/270 |
| 6,456,170 B1 | * | 9/2002 | Segawa et al. .............. | 331/143 |
| 6,570,426 B2 | * | 5/2003 | Nakashimo .................. | 327/265 |
| 6,586,962 B2 | * | 7/2003 | Sakurai et al. ................ | 326/16 |
| 6,778,024 B2 | * | 8/2004 | Gupta et al. .................. | 331/16 |
| 6,806,695 B1 | * | 10/2004 | Broach et al. ............... | 323/364 |
| 6,922,073 B2 | * | 7/2005 | Haase et al. .................. | 326/27 |
| 6,924,658 B2 | * | 8/2005 | Peng .......................... | 324/765 |

* cited by examiner

Primary Examiner—Timothy P. Callahan
Assistant Examiner—Hai L. Nguyen
(74) Attorney, Agent, or Firm—Alan K. Stewart; W. James Brady; Frederick J. Telecky, Jr.

(57) ABSTRACT

The self correcting scheme to match pull up and pull down devices includes: a first comparator for comparing a common mode signal to a high reference limit; a second comparator for comparing the common mode signal to a low reference limit; a first flip flop having an input coupled to an output of the first comparator; a second flip flop having an input coupled to an output of the second comparator; a counter having inputs coupled to the first and second flip flops; and a delay device controlled by an output of the counter, wherein the delay device provides a pull down control signal that is delayed relative to a pull up control signal.

7 Claims, 1 Drawing Sheet

SELF CORRECTING SCHEME TO MATCH PULL UP AND PULL DOWN DEVICES

FIELD OF THE INVENTION

The present invention relates to electronic circuitry and, in particular, to a self correcting scheme to match pull up and pull down devices.

BACKGROUND OF THE INVENTION

CAN is a differential signaling system that makes use of two bus lines namely CANH and CANL. Data communication occurs mainly by differentiating between the two possible states on the bus—a dominant state during which a differential voltage is established between the two bus lines and a recessive state during which there is no differential voltage. In the latter state, CANH and CANL are both in a high-z (high impedance) state and the driver is inactive.

One of the specifications for CAN is that the difference in common mode voltage between dominant and recessive states should be less than 120 mV and during transitions the spikes in the common mode voltage should be restricted below the same values, if not completely avoided. A prior art CAN driver is shown in FIG. 1. The node CANH is pulled up by PMOS transistor 20 and node CANL is pulled down by NMOS transistor 22 in the dominant state. Since NMOS transistor 22 and PMOS transistor 20 always have a difference in strengths and threshold voltage (Vt), NMOS transistor 22 typically turns on faster when the two devices are attempted to be turned on at the same time. Node CANL gets pulled down first and there is a negative spike in the common mode signal. To some extent this can be alleviated by delaying the control signal to NMOS transistor 22 as compared to PMOS transistor 20, but a fixed delay almost never solves the problem completely due to process, temperature and signal voltage variation.

SUMMARY OF THE INVENTION

A self correcting scheme to match pull up and pull down devices includes: a first comparator for comparing a common mode signal to a high reference limit; a second comparator for comparing the common mode signal to a low reference limit; a first flip flop having an input coupled to an output of the first comparator; a second flip flop having an input coupled to an output of the second comparator; a counter having inputs coupled to the first and second flip flops; and a delay device controlled by an output of the counter, wherein the delay device provides a pull down control signal that is delayed relative to a pull up control signal.

DETAILED DESCRIPTION OF PREFERRED EMBODIMENTS

Figure 2:
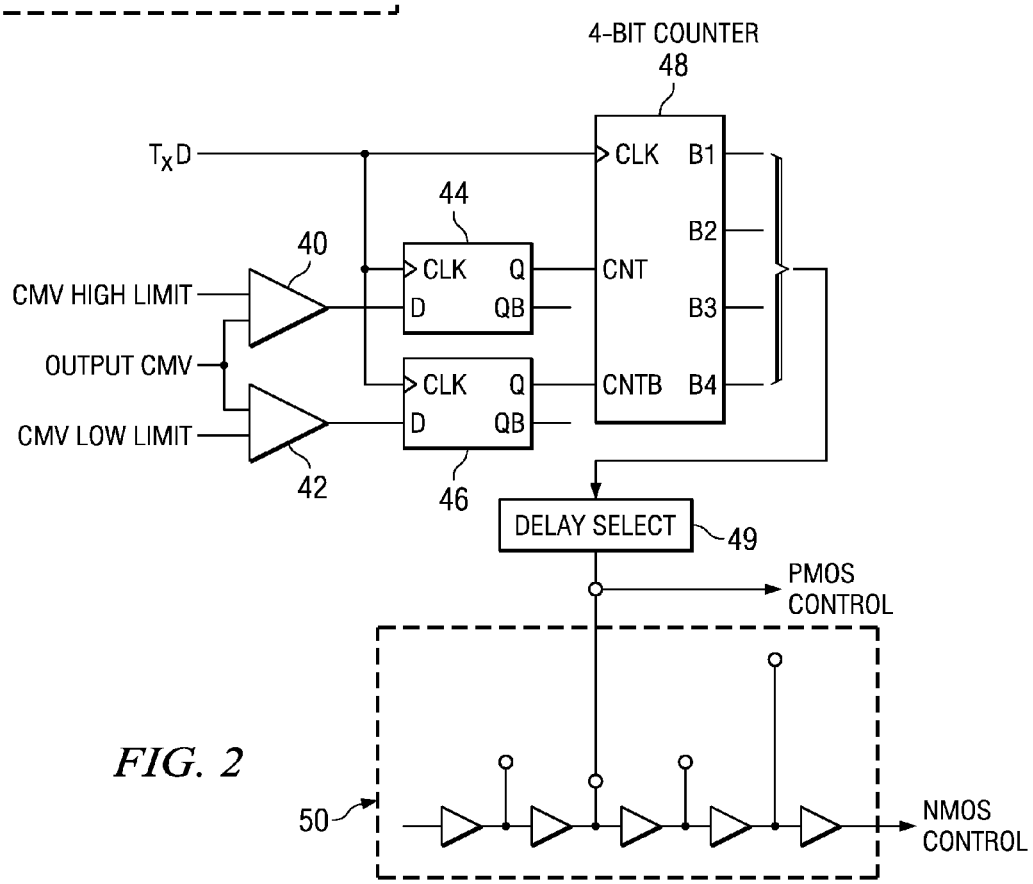
FIG. 2 is a circuit diagram of a preferred embodiment feed back loop that implements a self correcting delay equalization scheme according to the present invention.

FIG. 2 shows a preferred embodiment feed back loop that implements a self correcting delay equalization scheme according to the present invention. A window comparator is used to monitor the common mode voltage on the CAN bus. When the common mode (CM) spike exceeds a +/−120 mV window (CMV High Limit or CMV Low Limit) around the CM voltage Output CMV, comparator 40 or comparator 42 switches, and a positive or a negative spike can be identified based on which comparator switches. These transitions on the outputs of comparators 40 and 42 are captured by edge triggered flip-flops 44 and 46 that trigger off of the CAN control signal TxD. The signal TxD is also the same signal that determines when a dominant and recessive state occurs.

Figure 1:
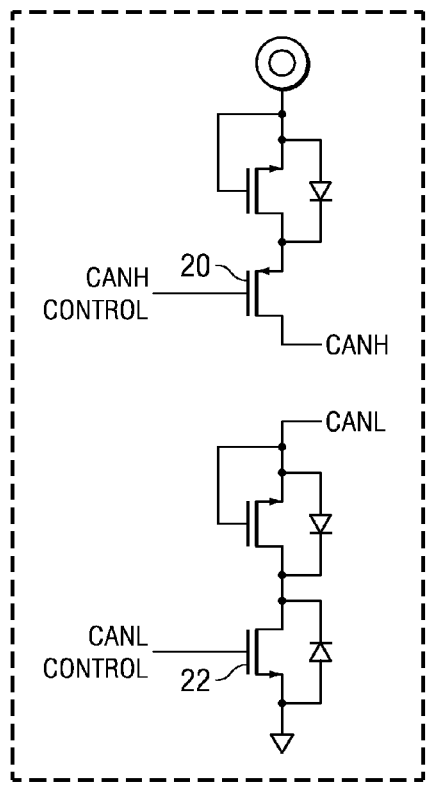
FIG. 1 is a circuit diagram of a prior art CAN driver.

A 4 bit counter 48 counts backwards or forward depending on transitions captured by the flip-flops 44 and 46 which in turn depend on the CM spiking negative or positive. When a negative spike occurs (meaning NMOS transistor 22 turns on faster), the counter counts backwards and when a positive spike occurs the counter counts forward. The output of counter 48 is used to control the delay select device 49 to tap off the delayed controlled signal (PMOS Control) that turns on PMOS pull up device 20, shown in FIG. 1. An inverter chain 50 (delay device) with, for example, 32 inverters (delay elements) is used to delay the control signal to PMOS transistor 20 and the output of counter 48 is used to pick one of the 32 possible tap points on the inverter chain 50. A lower count on the counter translates to a lesser delay for the signal PMOS Control (which in turn means faster turn on for PMOS device 20 and this decreases the negative spiking on the CM signal). NMOS device 22 is controlled by signal NMOS Control, the final output of the inverter chain. In this way the delay for the PMOS control signal is adjusted dynamically until there is very little spiking on the CM signal. In the steady state, the counter 48 switches back and forth between two consecutive numbers if the resolution of the delay is insufficient to finally quell the spiking to a value below the voltage window used for the window comparator.

Thus a self correcting scheme is implemented that corrects itself over a few dominant and recessive transitions after start up (a worst case of 32 cycles when using a 4-bit counter). The same feed back loop is also used to correct the turn off times in the CAN driver during the dominant to recessive transition. This sort of a feedback scheme can be used in general to match any transitions that may be mismatched for varied reasons. The resolution is only limited by the number of bits used for the counter and the speed of the comparators used for detecting glitches in the common mode signal. The comparators 40 and 42 can be as simple as a detect device (matched to the driver device) driving a current source. The output of such a comparator can be used to drive an inverter that gives a logic signal that is indicative of when the detect device turns on and becomes stronger than the current threshold set by the fixed current source in the comparator scheme.

Prior art solutions relied on sizing the PMOS and NMOS very accurately by trial and error and made use of the fact that the mismatch can be reduced when the turn on times are very fast. Mismatch could only be reduced by driving the PMOS and NMOS with a fast transitioning signal but in applications where slope control is necessary, speed cannot be used to mask mismatch. Even these seemingly useful techniques fail to meet requirement because all the delay and speed settings of the control signals may have to be preset or trimmed in and these still do not cater to problems due to variation in process, temperature and supply.

The present invention uses a feed back loop for self correction of common mode spiking, which eliminates the need for trim and experimentation. This solution is thus robust and can be implemented with relative ease using a few digital blocks. Since the feedback loop directly monitors the desired performance it helps meet the specifications with more accuracy. The method is robust and the correction adjusts itself with changes in temperature and supply.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
    a first comparator for comparing an input signal to a high reference limit;
    a second comparator for comparing the input signal to a low reference limit;
    a first flip flop having an input coupled to an output of the first comparator;
    a second flip flop having an input coupled to an output of the second comparator;
    a counter having inputs coupled to the first and second flip flops; and
    a delay device controlled by an output of the counter, wherein the delay device provides a pull down control signal that is delayed relative to a pull up control signal.

2. The circuit of claim 1 wherein the pull down control signal controls an NMOS transistor.

3. The circuit of claim 1 wherein the pull up control signal controls a PMOS transistor.

4. The circuit of claim 1 wherein the delay device comprises multiple delay elements coupled in series.

5. The circuit of claim 4 wherein the delay elements are inverters.

6. The circuit of claim 4 wherein the pull down control signal is provided by a last delay element in the multiple delay elements coupled in series.

7. The circuit of claim 4 wherein the pull up control signal is provided by selecting one of the multiple delay elements coupled in series based on the output of the counter.

* * * * *